(12) United States Patent
Shoji et al.

(10) Patent No.: US 7,126,482 B2
(45) Date of Patent: Oct. 24, 2006

(54) RFID TAG AND ITS MANUFACTURING METHOD

(75) Inventors: Noriyuki Shoji, Tokyo (JP); Koichi Maeno, Tokyo (JP); Masataka Iegaki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/092,906

(22) Filed: Mar. 30, 2005

(65) Prior Publication Data
US 2005/0179552 A1   Aug. 18, 2005

Related U.S. Application Data

(63) Continuation of application No. PCT/JP03/12529, filed on Sep. 30, 2003.

(30) Foreign Application Priority Data

Sep. 30, 2002   (JP)   ............................. 2002-284744
Jan. 16, 2003   (JP)   ............................. 2003-007938

(51) Int. Cl.
*G08B 13/14* (2006.01)

(52) U.S. Cl. .............................. 340/572.7; 340/572.8; 340/572.1; 343/718

(58) Field of Classification Search ............. 340/572.7, 340/572.8, 572.1; 29/825; 235/492, 449, 235/385; 343/866, 867, 718, 788
See application file for complete search history.

(56) References Cited

U.S. PATENT DOCUMENTS 5,844,783 A * 12/1998 Kojima ........................ 361/777
6,098,271 A * 8/2000 Yamamoto et al. .......... 29/603.06
6,130,612 A * 10/2000 Castellano et al. .......... 340/572.6
6,549,176 B1 * 4/2003 Hausladen ................... 343/895

FOREIGN PATENT DOCUMENTS

| EP | 554486 B1 | 8/2003 |
|---|---|---|
| JP | 8-204432 | 8/1996 |
| JP | 11-328354 | 11/1999 |
| JP | 2002-246829 | 8/2002 |
| JP | 2002-252518 | 9/2002 |
| JP | 2002-271127 | 9/2002 |

\* cited by examiner

*Primary Examiner*—Anh V. La
(74) *Attorney, Agent, or Firm*—Oblon, Spivak, McClelland, Maier & Neustadt, P.C.

(57) ABSTRACT

An RFID tag which is provided with a coil-shaped antenna such that a conductor is placed on the periphery of a magnetic core, the RFID comprising: the magnetic core, an FPC wound on the periphery of the magnetic core, two or more linear conductor patterns formed in parallel with one another on the FPC, an IC that is connected to the linear conductor patterns and disposed on the FPC, a crossover pattern that electrically connects one end and the other end of outermost linear conductor patterns among the linear conductor patterns formed in parallel with one another, where in the two or more linear conductor patterns, adjacent linear conductor patterns in a joint portion in the wound FPC are electrically connected in respective start edges and end edges.

23 Claims, 13 Drawing Sheets

RFID TAG AND ITS MANUFACTURING METHOD

This application is a continuation of PCT/JP03/12529 filed on Sep. 30, 2003.

BACKGROUND OF THE INVENTION

1. Field of the Invention

The present invention relates to an RFID (Radio Frequency Identification) tag which is a tag for use in article management, etc. provided with an antenna for transmission and reception and an IC chip for signal write and read and its manufacturing method.

2. Related Art

RFID tags have been used conventionally in article management, etc. Each of the RFID tags is provided with an antenna coil and elements such as an IC connected to the antenna coil, activated by receiving a signal with a predetermined frequency transmitted from an interrogator in the antenna coil, thereby driving the elements such as an IC, communicates with the interrogator, and carries out article management or the like by reading data stored in the IC element, while writing new data in the IC element. The RFID tag are generally attached to a surface of an article to use, and as a structure of the antenna coil to stabilize frequency characteristics when the article is metal, such a structure is proposed that a coil is wound on the outer periphery of a magnetic core (for example, see FIGS. 5 and 6 in JP 2000-101471).

Further, in order to solve the problem that the entire antenna becomes relatively thick when the coil is wound on the outer periphery of the magnetic core as described above, such an RFID tag is proposed that a meandering conductive material is formed on an FPC, a slits are provided between the conductive material, and plane-shaped magnetic cores are inserted into the slits alternately in right and back sides to form an antenna coil (for example, see JP2002-117383).

However, the conventional RFID tags have following problems in terms of efficient manufacturing. In other words, in the RFID as described in patent document 1, in winding the conductive material around the magnetic core, the winding speed is not increased when the magnetic core is a flat plate, and there are limitations in increasing the productivity, resulting in an obstacle to cost reduction in a recent situation where thinning of RFID tags is requested.

Further, in the RFID as described in JP2002-117383, it is necessary to suck the FPC with a vacuum suction apparatus when inserting the plane-shaped magnetic cores into the slits, a large-scale apparatus is required for the manufacturing, and there are limitations in increasing efficiency of the manufacturing.

Furthermore, when an RFID tag is attached to a metal article to use, there arises a problem that frequency characteristics fluctuate due to the interaction between the metal article and the antenna coil. As measures against the fluctuations of the frequency characteristics, it is considered to place a metal plate for shielding inside the FRID tag, but the size of the RFID tag increases, while the cost is also increased, and in these respects, there are significant disadvantages.

SUMMARY OF THE INVENTION

It is an object of the present invention to provide an RFID tag enabling efficient manufacturing thereof, an efficient manufacturing method of an RFID tag, and an RFID tag enabling effective measures against fluctuations of frequency characteristics to be carried out without resulting in increases in cost and size.

A first aspect of the present invention is an RFID tag which is provided with a coil-shaped antenna such that a conductor is placed on the periphery of a magnetic core, and has the magnetic core, an FPC wound on the periphery of the magnetic core, two or more linear conductor patterns formed in parallel with one another on the FPC, an IC that is connected to the linear conductor patterns and disposed on the FPC, and a crossover pattern that electrically connects one end and the other end of outermost linear conductor patterns among the linear conductor patterns formed in parallel with one another, where in the two or more linear conductor patterns, adjacent linear conductor patterns in a joint portion in the wound FPC are electrically connected in respective start edges and end edges.

According to the constitution, only by winding the FPC with conductor patterns formed thereon around a magnetic core, it is possible to achieve an RFID that is simple in structure and suitable for thinning. Further, it is possible to arrange structural elements such as linear conductor patterns, IC and crossover pattern necessary for the RFID tag beforehand on an FPC that is a plane, and it is not necessary to add a new structural element after the FPC is wound around the magnetic core and thus has a three-dimensional structure, whereby it is possible to achieve an RFID tag enabling increased productivity and cost reduction.

A second aspect of the RFID tag of the present invention is an RFID tag which is provided with a magnetic core including at least one magnetic material, a coil-shaped antenna such that a conductor is placed in a helical form on the periphery of the magnetic core, and an IC, where the coil-shaped antenna is obtained by winding an FPC around the magnetic core in which on one side of the FPC are formed two or more linear conductor patterns in parallel with one another, electrically connecting adjacent linear conductor patterns, thereby forming a helical current path on the periphery of the magnetic core, and further connecting one end and the other end of the current path.

Accordingly, by winding the FPC with two or more linear conductor patterns formed thereon around the magnetic core to connect, it is possible to make it function as a coil-shaped antenna comprised of the helical current path, and it is thus possible to achieve an RFID tag that is simple in structure and easy in production.

In a third aspect of the RFID tag of the present invention, the crossover pattern that electrically connects the one end and the other end of the current path is formed on the other side of the FPC different from the side on which the linear conductor patterns are formed.

Accordingly, since the crossover pattern is formed on the other side of the FPC different from the side on which the linear conductor patterns are formed, it is possible to connect the linear conductor patterns easily on the back side of the FPC.

In a fourth aspect of the RFID tag of the present invention, the linear conductor patterns and IC are formed on the inner side of the FPC wound around the magnetic core.

Accordingly, the linear conductor patterns and IC are wound inside not to be exposed, and therefore, can be protected from external forces such as an impact force during carrying. Further, the less tension is applied to the inner surface on which the IC is disposed than the outer surface in winding the FPC around the magnetic core, and it is possible to prevent damage to, particularly, IC terminal due to winding tension.

In a fifth aspect of the RFID tag of the present invention, the magnetic core is provided with a concave portion to store the IC.

Accordingly, since the IC is stored in the concave portion of the magnetic core, the storage portion does not protrude and it is possible to thin the RFID tag.

In a sixth aspect of the RFID tag of the present invention, a capacitive load is further provided which is formed on the FPC and connected to the IC.

Accordingly, it is possible to compensate for a fluctuation occurring in winding the FPC around the magnetic core or connecting the linear conductor patterns in a joint portion using the capacitive load (capacitor, etc.) for each RFID tag, and to distribute RFID tags with stable characteristics.

In a seventh aspect of the RFID tag of the present invention, the capacitive load has a comb-shaped conductor pattern formed on one side of the FPC and a conductor pattern provided in a position opposed to the comb-shaped conductor pattern on the other side of the FPC.

Accordingly, by simple operation such as removing the comb-shaped conductor pattern, it is possible to vary an opposite area of the capacitive load such as a capacitor to adjust the characteristics.

In an eighth aspect of the RFID tag of the present invention, the two or more linear conductor patterns are formed on the inner side of the FPC wound around the magnetic core, while a shield conductor pattern that is not electrically connected to the coil-shaped antenna is formed on the outer side of the FPC wound around the magnetic core.

Accordingly, since the shield conductor pattern is disposed outside the coil-shaped antenna while being wound around the magnetic core, it is possible to reduce effects exerted on the coil-shaped antenna by external metal, and stabilize frequency characteristics of the RFID tag.

In a ninth aspect of the RFID tag of the present invention, the shield conductor pattern is disposed at least on the side opposed to an object to which the RFID tag is attached of the FPC wound around the magnetic core.

Accordingly, since the shield conductor pattern exists between the coil-shaped antenna wound around the magnetic core and the object to which the RFID tag is attached, it is possible to reliably reduce effects from the metal that is the object targeted for the attachment, and to stabilize frequency characteristics of the RFID tag.

In a tenth aspect of the RFID tag of the present invention, the FPC is bonded in the vicinity of a corner of the magnetic core.

Accordingly, the sag hardly occurs on the FPC wound around the magnetic core in bonding the FPC, and characteristics of the RFID tag are stabilized.

In an eleventh aspect of the RFID tag of the present invention, the shield conductor pattern formed on the outer side of the FPC wound around the magnetic core is disposed in an area that is not opposed to the linear conductor patterns.

Accordingly, since the shield conductor pattern is disposed to be opposed to an area where the linear conductor patterns are not formed on the inner side of the FPC, it is possible to suppress capacitive coupling of the coil-shaped antenna and the shield conductor pattern, while reducing effects of the external metal, and to reduce the frequency drift.

A first aspect of a manufacturing method of an RFID tag of the present invention has at least the steps of forming two or more linear conductor patterns and a crossover pattern on an FPC, placing an IC on the FPC, winding the FPC around a magnetic core, and electrically connecting start edges or end edges of the linear conductor patterns adjacent to one another. Further, in winding the FPC around the magnetic core, the FPC may be fixed to the magnetic core in advance before being bonded, using a two-sided tape, etc.

According to the manufacturing method, it is only required to wind the FPC with conductor patterns formed thereon around the core, without needing the step of winding a conductor around the core, whereby speed of the winding does not need to be considered. Further, it is possible to arrange structural elements such as linear conductor patterns, IC and crossover pattern necessary for the RFID tag beforehand on an FPC that is a plane, and it is not necessary to add a new structural element after the FPC is wound around the magnetic core and thus has a three-dimensional structure, whereby it is possible to implement efficient manufacturing.

A second aspect of the manufacturing method of a RFID tag of the present invention has the steps of forming two or more linear conductor patterns on one side of an FPC, winding the FPC around the magnetic core, electrically connecting the linear patterns adjacent to form a helical current path on the periphery of the magnetic core, and further connecting one end and the other end of the helical current path.

Accordingly, the FPC with two or more linear conductor patterns formed thereon is wound around the core, and the helical current path is formed due to electrical connection, whereby it is possible to manufacture FRID tags efficiently without complicated steps.

A third aspect of the manufacturing method of an RFID tag of the present invention has the steps of forming two or more linear conductor patterns on one side of an FPC, forming a crossover pattern that electrically connects one end and the other end of the helical current path on the other side different from the side on which the linear conductor patterns are formed, winding the FPC around a magnetic core, electrically connecting the linear patterns adjacent to form a helical current path on the periphery of the magnetic core, and further connecting the one end and the other end of the helical current path.

Accordingly, the crossover pattern is formed on the other side of the FPC that is different from the side on which the linear conductor patterns are formed, and it is thus possible to configure a coil-shaped antenna on the FPC readily only by simple connection operation.

A fourth aspect of the manufacturing method of an RFID tag of the present invention further has the steps of performing an operation check before the step of connecting where the linear conductor patterns have dummy connecting portions where adjacent linear conductor patterns are connected at the start edge or end edge and form a meander-shaped current path, and the step of removing the dummy connecting portions before or after the step of connecting.

Accordingly, the electrical operation check of the FPC itself is made easy, while the configuration of the coil-shaped antenna on the FPC is further facilitated by removing the dummy connecting portions after winding the FPC around the core.

A fifth aspect of the manufacturing method of an RFID tag of the present invention further has the step of forming a capacitive load on the FPC.

In a sixth aspect of the manufacturing method of an RFID tag of the present invention, the capacitive load has a comb-shaped conductor pattern formed on one side of the FPC and a conductor pattern provided in a position opposed to the comb-shaped conductor pattern on the other side of the FPC.

A seventh aspect of the manufacturing method of an RFID tag of the present invention has the step of measuring the resonance frequency of the coil after forming the coil due to the FPC, and adjusting the electrostatic capacitance of the capacitive load corresponding to the drift from the desired resonance frequency.

In an eighth aspect of the manufacturing method of an RFID tag of the present invention, the step of adjusting the capacitor is performed by removing at least part of the comb-shaped conductor pattern formed on one side of the FPC or a conductor pattern provided in a position opposed to the comb-shaped conductor pattern on the other side of the FPC.

Accordingly, by removing part of the conductor pattern formed on the FPC, it is possible to adjust characteristics of the RFID tag optionally, and distribute RFID tags with small characteristic fluctuations and high reliability. Further, since the adjustment can be made by simple operation such as partial removal of the conductor pattern, characteristics of the RFID tag can be adjusted efficiently.

In a ninth aspect of the manufacturing method of an RFID tag of the present invention, the two or more linear conductor patterns are formed on one side of the FPC, a shield conductor pattern is formed on the other side of the FPC, and in the step of winding the FPC around the magnetic core, the side of the FPC on which the linear conductor patterns are formed is an inner side when the FPC is wound around the magnetic core, while the other side of the FPC on which the shield conductor pattern is formed is an outer side when the FPC is wound around the magnetic core.

Accordingly, the FPC is wound around the core, and the shield conductor pattern is arranged outside the coil-shaped antenna, whereby it is not necessary to provide a metal plate inside the RFID tag separately, and it is possible to manufacture RFID tags with stable characteristics.

In a tenth aspect of the manufacturing method of an RFID tag of the present invention, the shield conductor pattern is formed on part of the side on which the shield conductor pattern is formed, and in the step of winding the FPC around the magnetic core, the FPC is wound so that the shield conductor pattern is disposed at least in an area opposed to an object to which the RFID tag is attached.

Accordingly, since the FPC is wound around the core and the shield conductor pattern is disposed between the coil-shaped antenna and the object targeted for the attachment, it is not necessary to provide a metal plate between the antenna and the attachment-target object, and it is possible to manufacture RFID tags with stable characteristics.

In an eleventh aspect of the manufacturing method of an RFID tag of the present invention, in the step of forming the helical current path, the wound FPC is bonded, thereby connecting adjacent linear conductor patterns, and the helical current path is thus formed.

In a twelfth aspect of the manufacturing method of an RFID tag of the present invention, a joint portion where the wound FPC is bonded is disposed in the vicinity of a corner of the magnetic core.

DETAILED DESCRIPTION OF THE PREFERRED EMBODIMENTS

Figure 1:
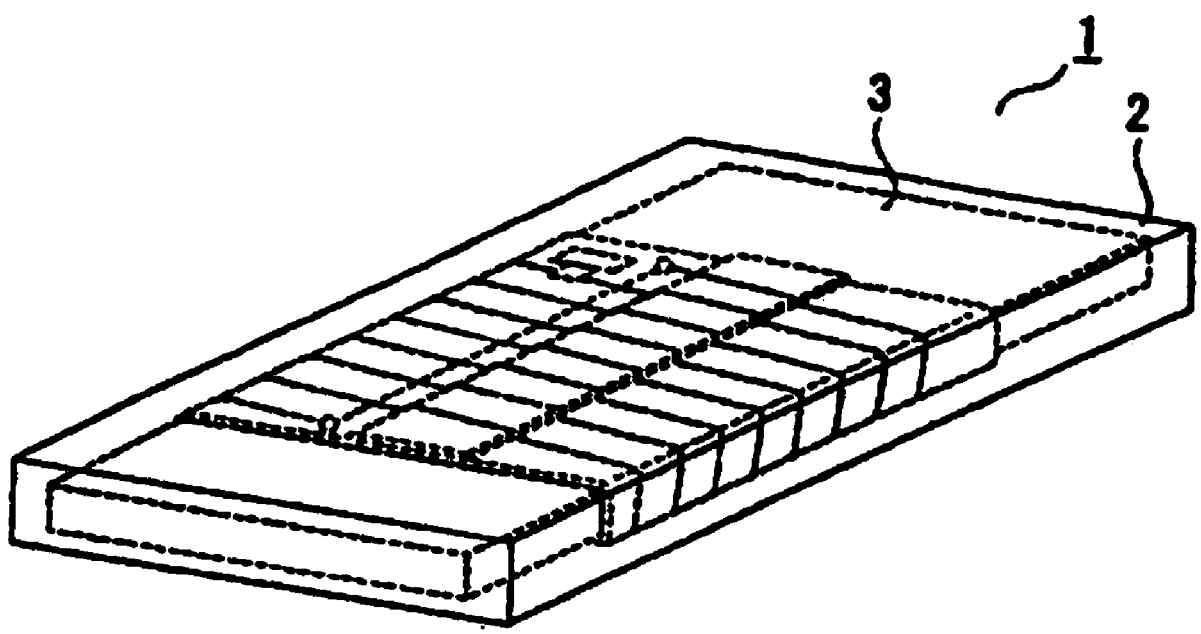
FIG. 1 is a view showing an RFID tag according to the first embodiment.

The first embodiment of the present invention will be described below with reference to FIGS. 1 to 8. FIG. 1 is a view showing an RFID tag according to the first embodiment. In FIG. 1, the RFID tag 1 is formed in the shape of a card where a transmitter/receiver 3 is incorporated into a resin case 2 such as ABS.

Figure 2:
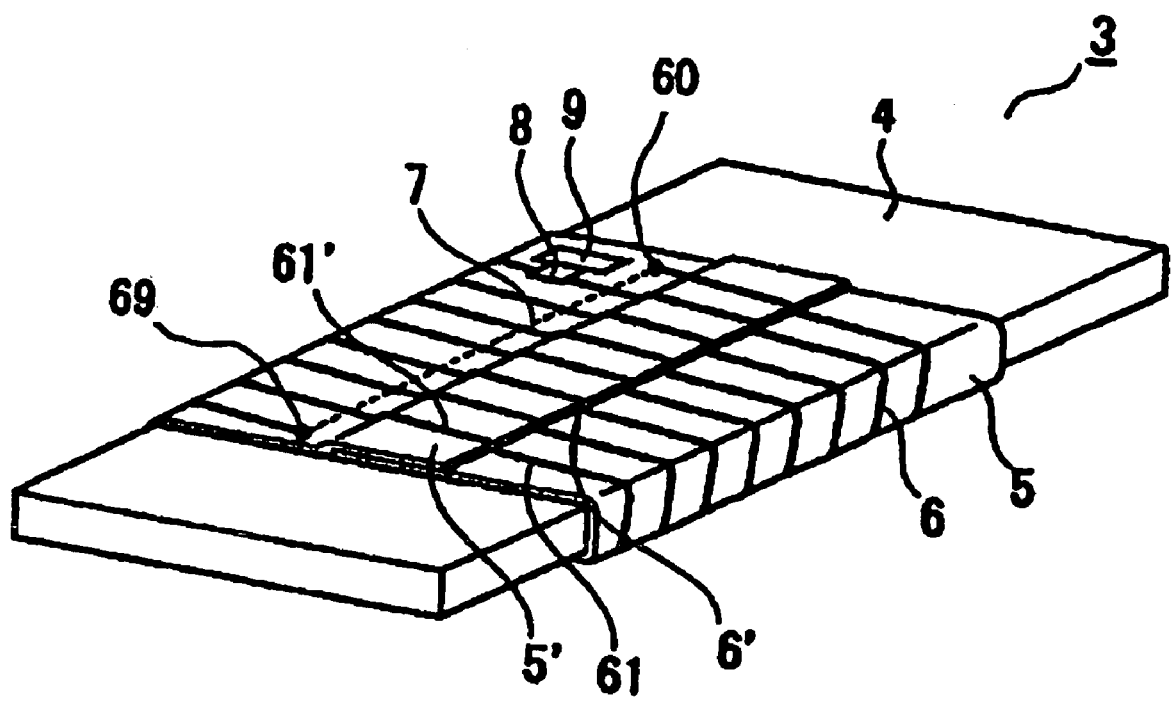
FIG. 2 is a view showing a structure of the transmitter/receiver of the RFID tag 1 according to the first embodiment.

FIG. 2 is a view showing a structure of the transmitter/receiver 3 of the RFID tag 1 according to the first embodiment. As shown in FIG. 2, the transmitter/receiver 3 has the structure such that an FPC 5 is wound around a magnetic core 4 such as ferrite, ferrite-contained resin, and amorphous sheet. In addition, as the magnetic core 4, it is preferable to use a material having the flexibility such as the ferrite-contained resin and amorphous sheet to prevent the member 4 from cracking.

The FPC 5 is, for example, obtained by forming a resin such as PET, PI, PEN and liquid crystal polymer into a sheet with a thickness of about 30 μm. Linear conductor patterns 6 and capacitor 9 are formed on one side of the FPC 5, and to the linear conductor pattern 6 is connected an IC 8 which is bonded on the FPC 5 with an epoxy based adhesive or the like. Further, on the other side of the FPC 5 is formed a crossover pattern 7 that is connected to end portions 60 and 69 of linear conductor patterns 6 which are positioned at opposite ends.

Figure 5:
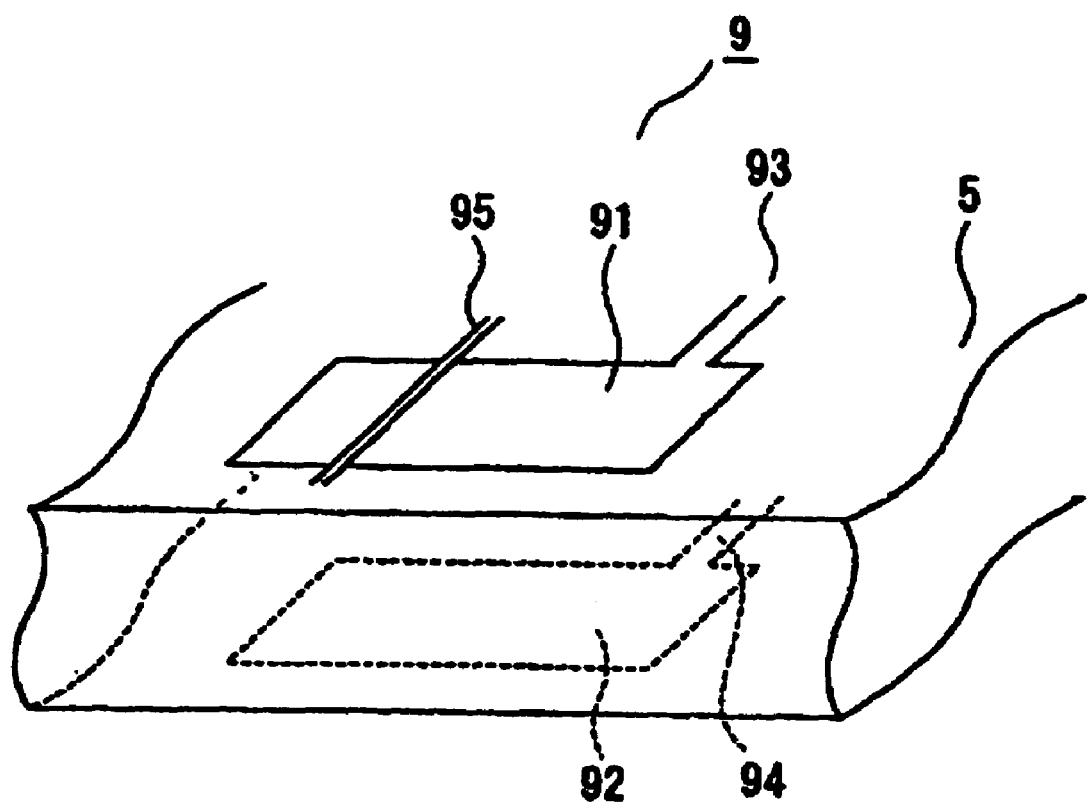
FIG. 5 is a view showing a capacitor of the RFID tag according to the first embodiment.

The linear conductor patterns 6 and crossover pattern 7 are formed for example by etching copper or aluminum, printing silver paste, or the like. The capacitor 9 is formed by forming an upper conductor 91 and a lower conductor 92 to be opposed to each other via the FPC 5 as shown in FIG. 5, and connecting the connecting conductors 93 and 94 to the IC 8. The upper conductor 91, lower conductor 92, and connecting conductors 93 and 94 are formed by etching, printing or the like in the same way as in the linear conductor patterns 6 as described above.

Figure 3:
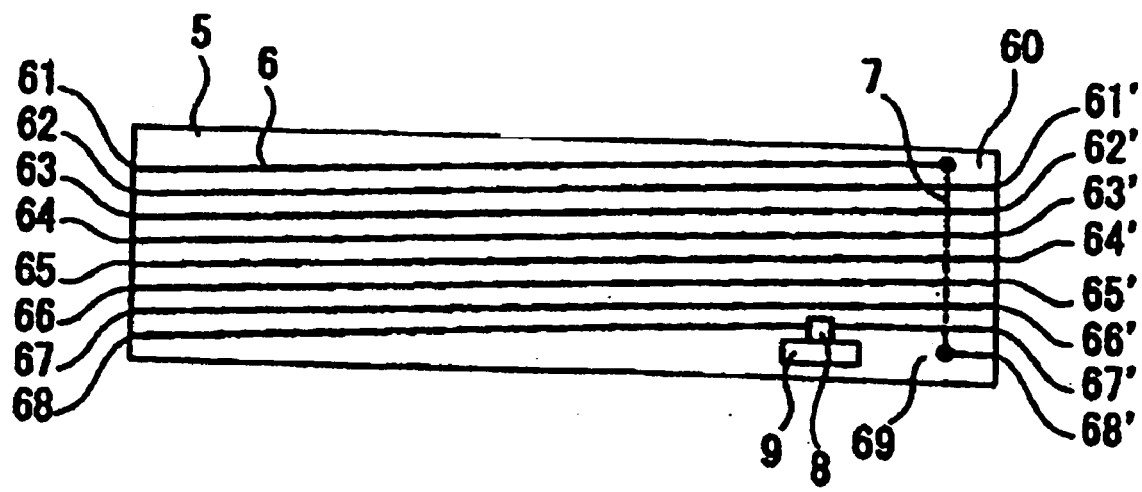
FIG. 3 shows the plane-shaped FPC before being wound around the magnetic core according to the first embodiment.

In the FPC 5 wound around the magnetic core 4, corresponding portions (61 and 61', 62 and 62', and so on) of the linear conductor patterns 6 are electrically connected by soldering, ultrasonic welding or the like in a joint portion 5'. It is thus possible to configure the transmitter/receiver 3 including a coil-shaped antenna such that the conductor is placed on the periphery of the magnetic core 4. In addition, FIG. 3 shows the plane-shaped FPC 5 before being wound around the magnetic core 4.

Figure 4:
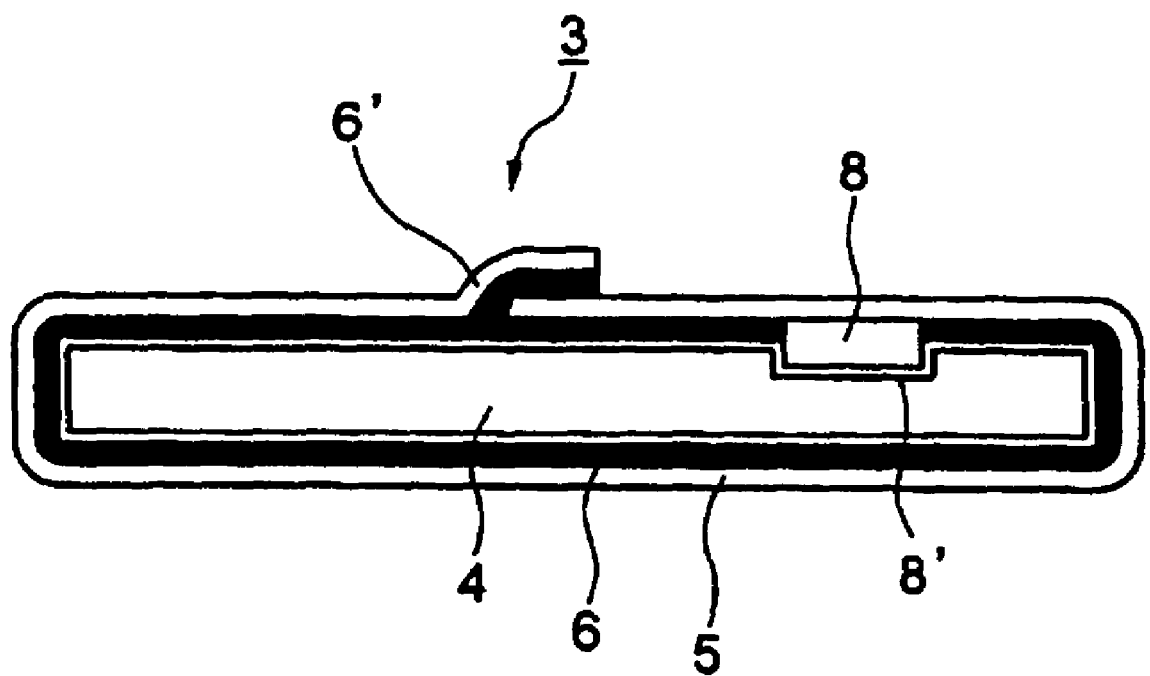
FIG. 4 is a cross sectional view showing a structure of the transmitter/receiver of the RFID tag according to the first embodiment.

In such an FPC 5, as shown in FIG. 4, it is preferable to provide an IC storage concave portion 8' in advance and wind the FPC 5 so that the side on which the linear conductor patterns 6 and IC 8 are provided is inside. In this case, the transmitter/receiver 3 is configured not to expose the linear conductor patterns 6 and IC 8, and therefore, can be protected from external forces such as an impact force during carrying. Further, since the tension in winding the FPC 5 is stronger on the outer side and the IC terminal susceptible to damage is on the inner side to which relatively low tension is applied, it is possible to prevent damage due to winding tension.

Figure 6:
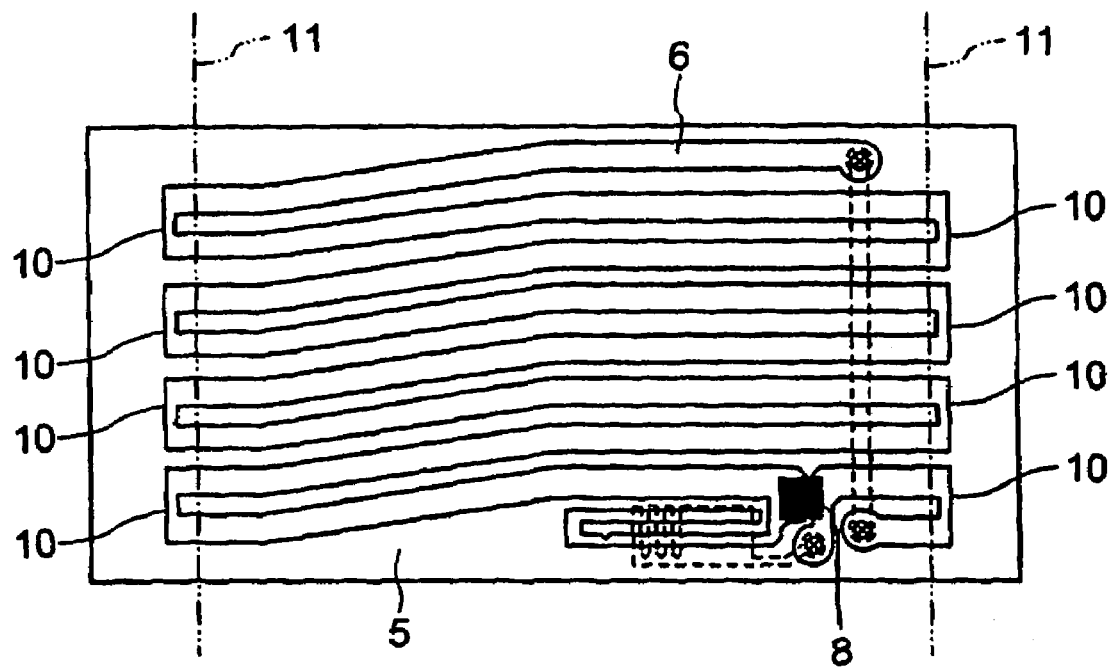
FIG. 6 is a view showing connection of the linear conductor patterns of the RFID tag according to the first embodiment.

Moreover, as shown in FIG. 6, the FPC 5 allows that adjacent linear conductor patterns 6 are connected in respective start edges or end edges in dummy connecting portions 10. In this case, since the circuit is formed and functions as a coil-shaped antenna before the FPC 5 is wound and one end and the other end of the linear conductor patterns 6 are connected via the crossover pattern 7, it is possible to perform various operation checks such as the operation check of the IC 8 and checks of conductor resistance and electrostatic capacitance in the FPC 5 itself in an early stage of RFID tag manufacturing, and to manufacture tags with stable quality efficiently.

In addition, by removing the dummy connecting portions 10 from removal lines 11 at appropriate timing such as after the FPC 5 is wound around the magnetic core 4, it is possible to configure the transmitter/receiver 3 as shown in FIG. 2 as a result.

The transmitter/receiver 3 obtained as described above sometimes causes fluctuations in its characteristics when the FPC 5 is wound around the magnetic core 4 or corresponding portions (61 and 61', 62 and 62' and so on) of the linear conductor patterns 6 are connected. In such cases, as shown in FIG. 5, for example, a notch 95 is made on the upper conductor 91 using a laser or the like to decrease an opposite area of the conductor so as to reduce the capacitance, and the characteristics are thereby compensated. In this case, the conductor may be cut with a cutter or removed, but using the laser enables the notch 95 to be made in a width of some extent, and thus is convenient.

A further preferred embodiment of the capacitor 9 will be described with reference to FIGS. 7 and 8.

Figure 7:
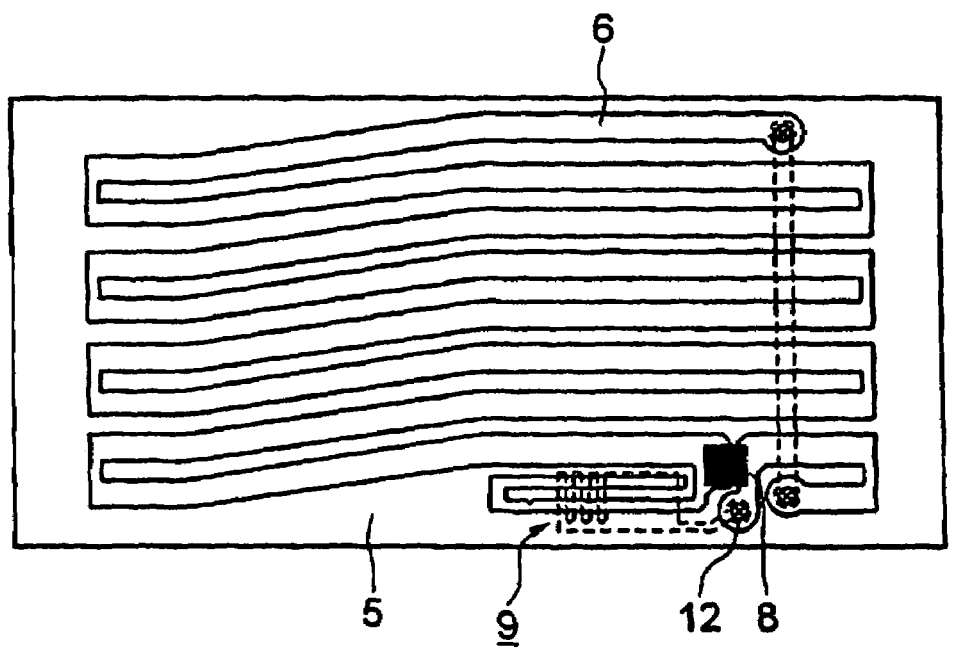
FIG. 7 is a view showing a preferred embodiment of the capacitor in the RFID tag according to the first embodiment.
Figure 8:
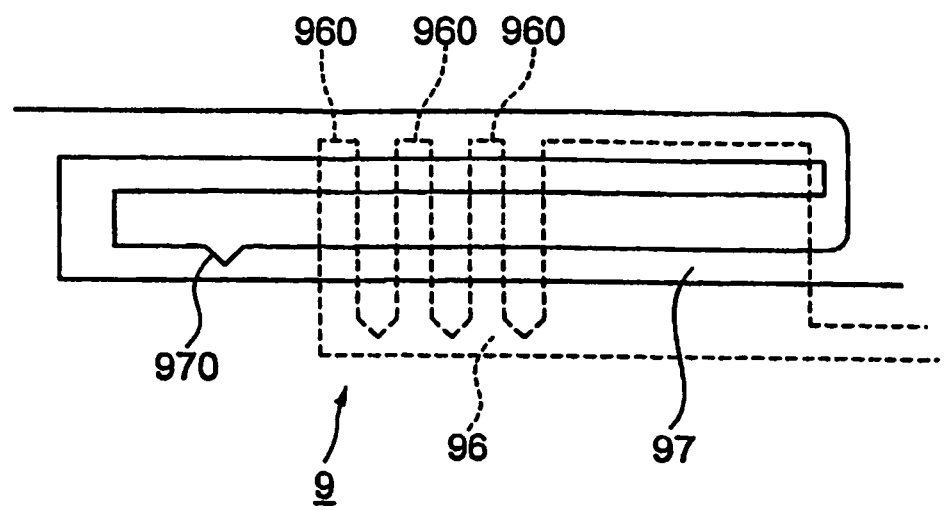
FIG. 8 is an enlarged view of a portion including the capacitor as shown in FIG. 7.

FIG. 7 is a view showing a preferred embodiment of the capacitor 9 in the RFID tag 1, and FIG. 8 is an enlarged view of a portion including the capacitor 9 as shown in FIG. 7. The capacitor 9 has a comb-shaped conductor pattern 96 having a plurality of combs 960 formed on one side of the FPC 5, and for example, a meander-shaped conductor pattern 97 formed on the other side of the FPC 5. The comb-shaped conductor pattern 96 and the conductor pattern 97 are arranged so that their parts are opposed to each other via the FPC 5. In addition, for example, the comb-shaped conductor pattern 96 formed on the back side of the linear conductor patterns 6 is connected to linear conductor patterns 6 in parallel with the IC 8 via a connecting portion 12 penetrating the FPC 5.

In the case of winding the FPC 5 so that the IC 8 and linear conductor patterns 6 become inside, a rough adjustment can be made by removing part of the conductor pattern 97 before the winding step. In such a case, by providing the dummy connecting portions 10, it is possible to make a rough adjustment while checking the characteristics to some extent. Further, a removal mark 970 for the rough adjustment is provided on the conductor pattern 97, and there arises a convenience that it is possible to select whether or not to remove a portion ahead of the removal mark 970, for example, based on whether or not the RFID tag 1 is used on a metal article.

The FPC 5 is then wound around the magnetic core 4, predetermined start edges and end edges of the linear conductor patterns 6 are connected, the dummy connecting portions 10 are removed, and thus the transmitter/receiver 3 is configured. Then, the combs 960 are removed one by one or every plurality of combs on the comb-shaped conductor pattern 96 of the capacitor 9 exposed on the outer side of the FPC 5, while measuring characteristics, whereby it is possible to adjust the capacitance of the capacitor 9, i.e. characteristics of the transmitter/receiver 3. In addition, the removal of the comb-shaped conductor pattern 96 and the conductor pattern 97 is performed by simple operation such as cutting the pattern with a cutter knife to peel from the FPC 5.

Thus formed transmitter/receiver 3 is incorporated into the resin case, and the RFID tag 1 is completed.

The second embodiment of the present invention will be described below with reference to FIGS. 9 to 15. In the second embodiment, a structure of the transmitter/receiver incorporated into the RFID is different from that in the first embodiment.

Figure 9:
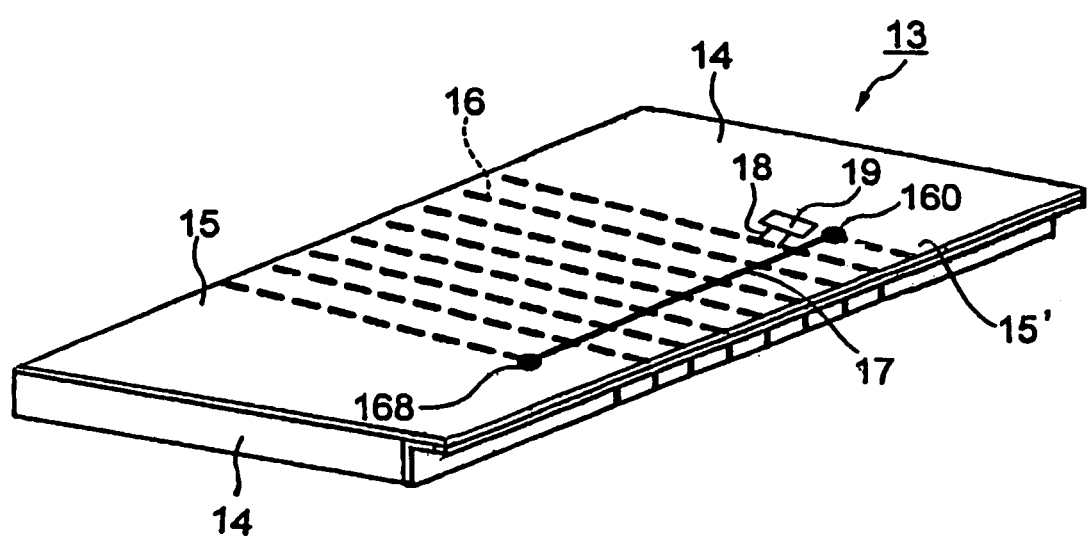
FIG. 9 is a view showing a structure of a transmitter/receiver of the RFID tag according to the second embodiment.

FIG. 9 is a view showing a structure of a transmitter/receiver 13 of the RFID tag 1 according to the second embodiment. The transmitter/receiver 13 as shown in FIG. 9 is provided with the structure such that an FPC 15 larger in size than in FIG. 2 is around a magnetic core 14. In the FPC 15 in this state, linear conductor patterns 16 are disposed on the inner side toward the magnetic core 14, a crossover pattern 17 is disposed on the outer side, and end portions 160 and 169 of linear conductor patterns 16 are connected to the crossover pattern 17. Further, a joint portion 15' is provided in the vicinity of a corner of the magnetic core 14. In addition, the material of the magnetic core 14, the material of the FPC 15 and the method of forming each conductor pattern are the same as in the first embodiment.

Figure 10:
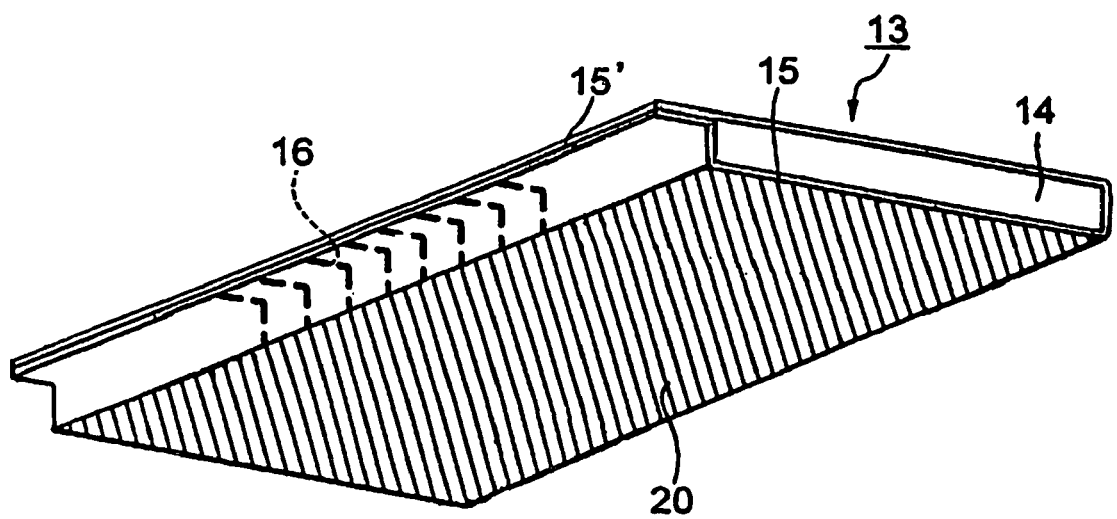
FIG. 10 is a view of the transmitter/receiver as shown in FIG. 9 viewed from the lower side.

Meanwhile, FIG. 10 is a view of the transmitter/receiver 13 as shown in FIG. 9 viewed from the lower side. As shown in FIG. 10, with the FPC 15 wound around the magnetic core 14, a shield conductor pattern 20 is disposed on the outer side with respect to the magnetic core 14 at the bottom of the transmitter/receiver 13. The shield conductor pattern 20 serves as a metal plate provided to prevent effects from being exerted on the coil-shaped antenna when a metal article, which is an object to which the RFID tag 1 is attached, approaches.

In FIGS. 9 and 10, in the FPC 15 wound around the magnetic core 14, corresponding portions of the linear conductor patterns 16 are electrically connected in the joint portion 15' in the vicinity of the corner of the magnetic core 14 as in the first embodiment. In addition, soldering and ultrasonic welding can be used in joining the FPC 15 in the joint portion 15'.

The case is described above where the joint portion 15' is positioned in the vicinity of the corner of the magnetic core 14, but the present invention is not limited to such a case, and the FPC 15 may be joined on the upper side of the magnetic core 14 on which the shield conductor pattern 20 is not disposed. In addition, by joining the FPC 15 in the vicinity of the corner of the magnetic core 14, it becomes easy to connect the linear conductor patterns 16 disposed on the inner side when the FPC 15 is wound around the magnetic core 14 in manufacturing the RFID tag 1, enabling improved operability.

Figure 11:
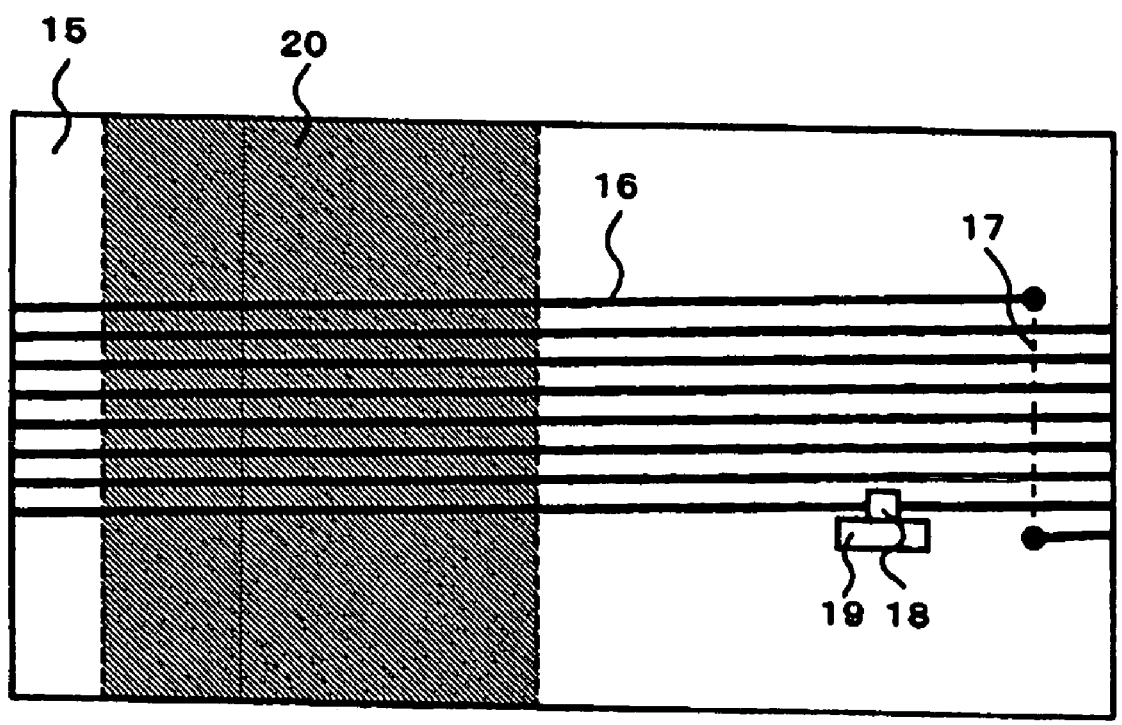
FIG. 11 is a view showing the plane-shaped FPC before being wound around the magnetic core according to the second embodiment.

FIG. 11 is a view showing the plane-shaped FPC 15 before being wound around the magnetic core 14 with one side and the other side overlapped and shown. In FIG. 11, on one side of the FPC 15, as in the first embodiment, linear conductor patterns 16 and capacitor 19 are formed and connected to the IC 18 bonded thereon. On the other side of the FPC 15 is formed the shield conductor pattern 20, as well as the crossover pattern 17 as in the first embodiment.

As shown in FIG. 11, a plurality of linear conductor patterns 16 formed on one side of the FPC 15 are configured (arranged) to be in relative positions such that the coil-shaped antenna is to be formed when the patterns 16 are electrically connected in the joint portion 15' as described above. In addition, as in the first embodiment, dummy portions may be provided that connect respective start edges and end edges of the linear conductor patterns 16. Further, the IC 18 and capacitor 19 are connected in a predetermined portion of the linear conductor pattern 16.

On the other side of the FPC 15, the crossover pattern 17 is formed in the right area as viewed in FIG. 11, while the shield conductor pattern 20 is formed in the left area as viewed in FIG. 11. In this case, when the FPC 15 such that the shield conductor pattern 20 is only formed in the left area in FIG. 11 is wound around the magnetic core 14 and joined in the joint portion 15', the shield conductor pattern 20 can be disposed in the lower area of the magnetic core 14 as shown in FIG. 10.

Figure 12:
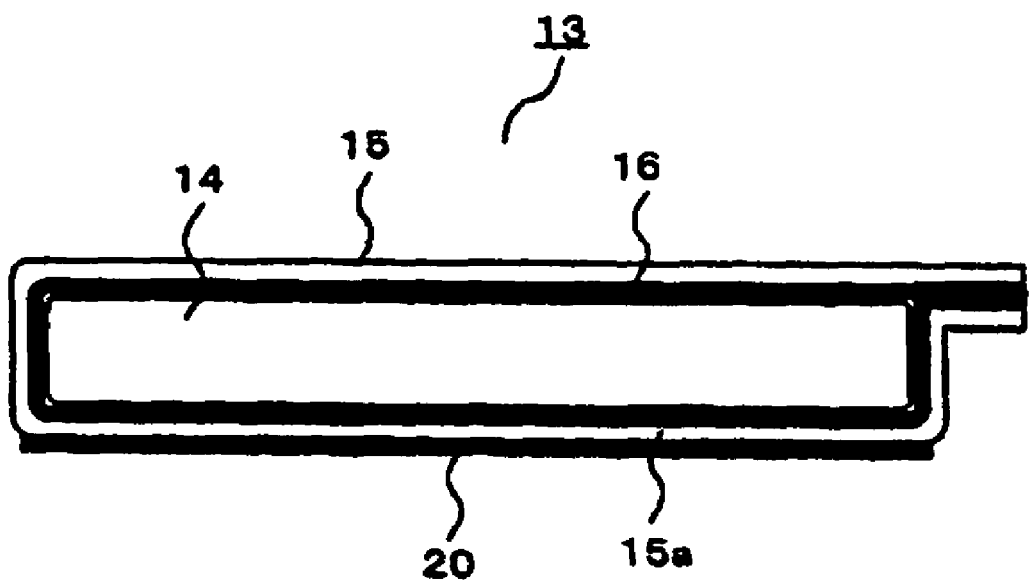
FIG. 12 is a cross sectional view showing of the transmitter/receiver of the RFID according to the second embodiment.

As described later, the shield conductor pattern 20 is not limited to the shape as shown in FIG. 12, and may be formed in various shapes. The second embodiment is characterized in that the shield conductor pattern 20 is formed on the side (back side) different from the side of the FPC 15 on which the linear conductor patterns 16 are formed. As described above, since the shield conductor pattern 20 is provided to reduce effects exerted on the coil-shaped antenna when the external attachment-target object approaches, it is necessary not to provide electrical connection between the linear conductor patterns 16, crossover pattern 17, IC 18 and capacitor 19 constituting the coil-shaped antenna and the shield conductor pattern 20.

FIG. 12 shows a cross sectional view of the structure of the transmitter/receiver 13 with the FPC 15 as shown in FIG. 11 wound around the magnetic core 14. In FIG. 12, the magnetic core 14 is disposed in the center, the linear conductor pattern 16 formed on the FPC 15 is disposed outside the member 14, a resin portion 15a of the FPC 15 is disposed outside the pattern 16, and the shield conductor pattern 20 is disposed outside the FPC 15 in the lower area of the magnetic core 14. In this case, a helical current path is formed on the periphery of the magnetic core 14 due to the linear conductor patterns 16 as in the first embodiment, and functions as the coil-shaped antenna. In addition, it is assumed in FIG. 12 that the object targeted for attaching the RFID tag 1 is placed in the lower area of the magnetic core 14.

When the RFID tag 1 configured as described above is attached to a metal article that is the attachment-target object in actually using the RFID tag 1, the coil-shaped antenna due to the linear conductor patterns 16 keeps the positional relationship such that the antenna is opposed to the metal article with the shield conductor pattern 20 existing therebetween. Accordingly, it is possible to adequately suppress effects that the metal article has on the frequency characteristics of the coil-shaped antenna.

Meanwhile, the distance between the linear conductor pattern 16 and the shield conductor pattern 20 is determined corresponding to the thickness of the resin portion 15a of the FPC 15, and it is general that the FPC 15 is provided with the resin portion 15a with a thickness of about 30 μm, for example. Since the resin portion 15a is capable of always maintaining the constant thickens stably, it is possible to avoid variations in frequency characteristics caused by variations in interval between the linear conductor pattern 16 and the shield conductor pattern 20, and to configure the coil-shaped antenna having stable frequency characteristics.

Figure 13:
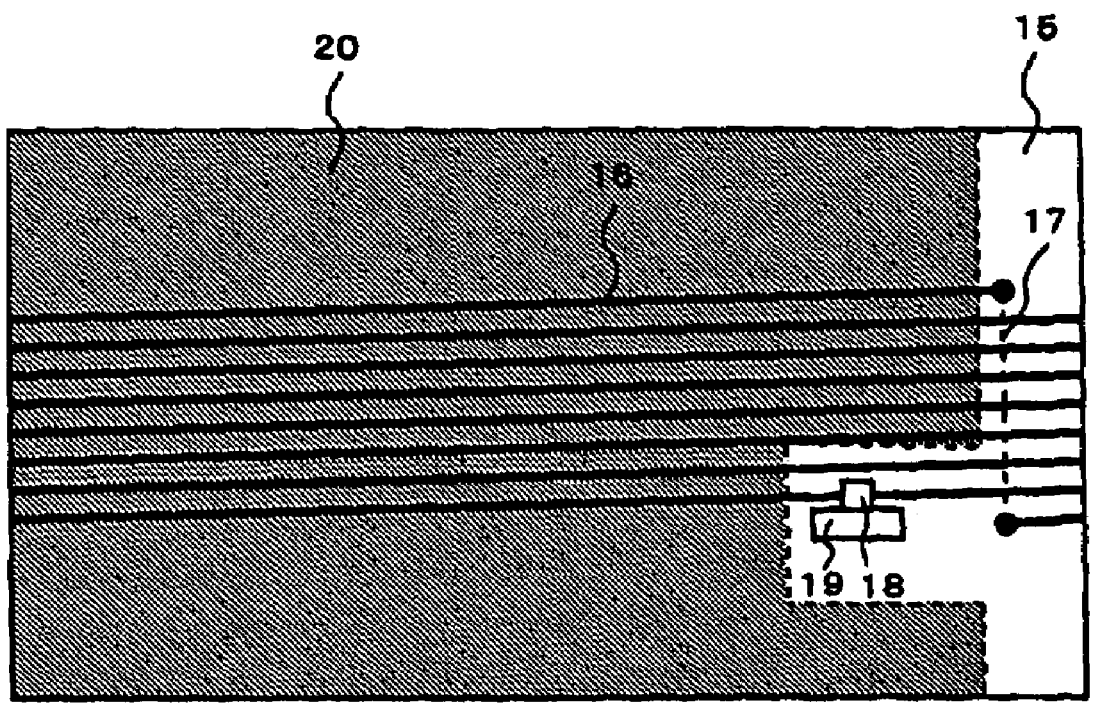
FIG. 13 shows the plane-shaped FPC before being wound around the magnetic core according to the first modification of the second embodiment.
Figure 14:
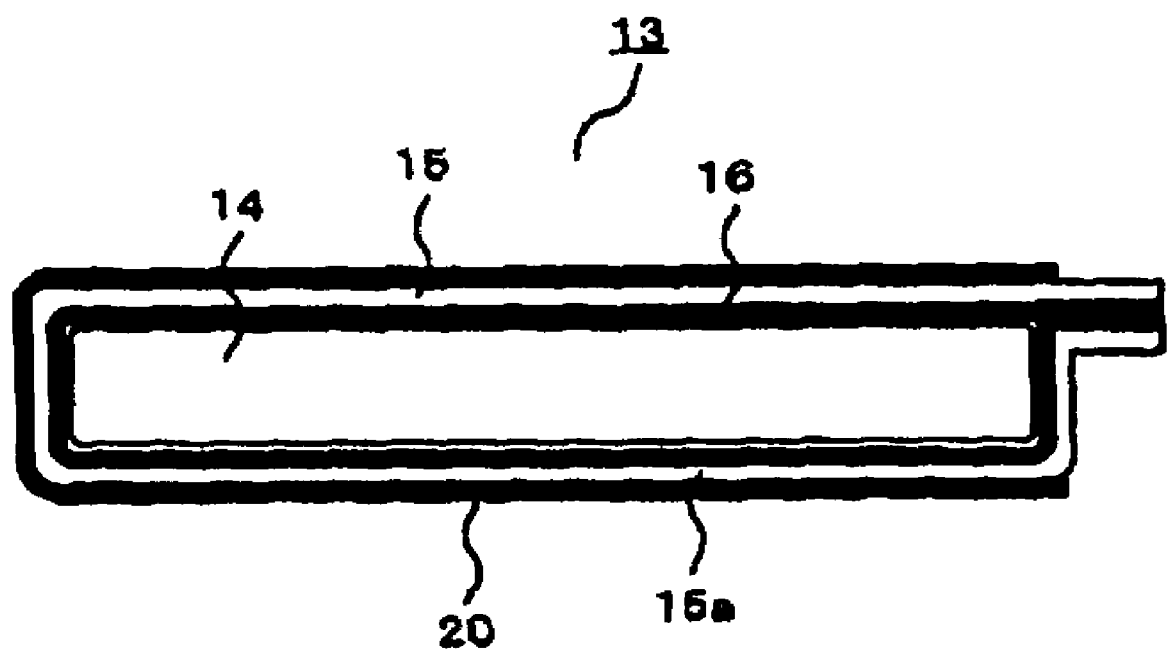
FIG. 14 is a cross sectional view showing a structure of the transmitter/receiver of the RFID tag according to the first modification of the second embodiment.
Figure 15:
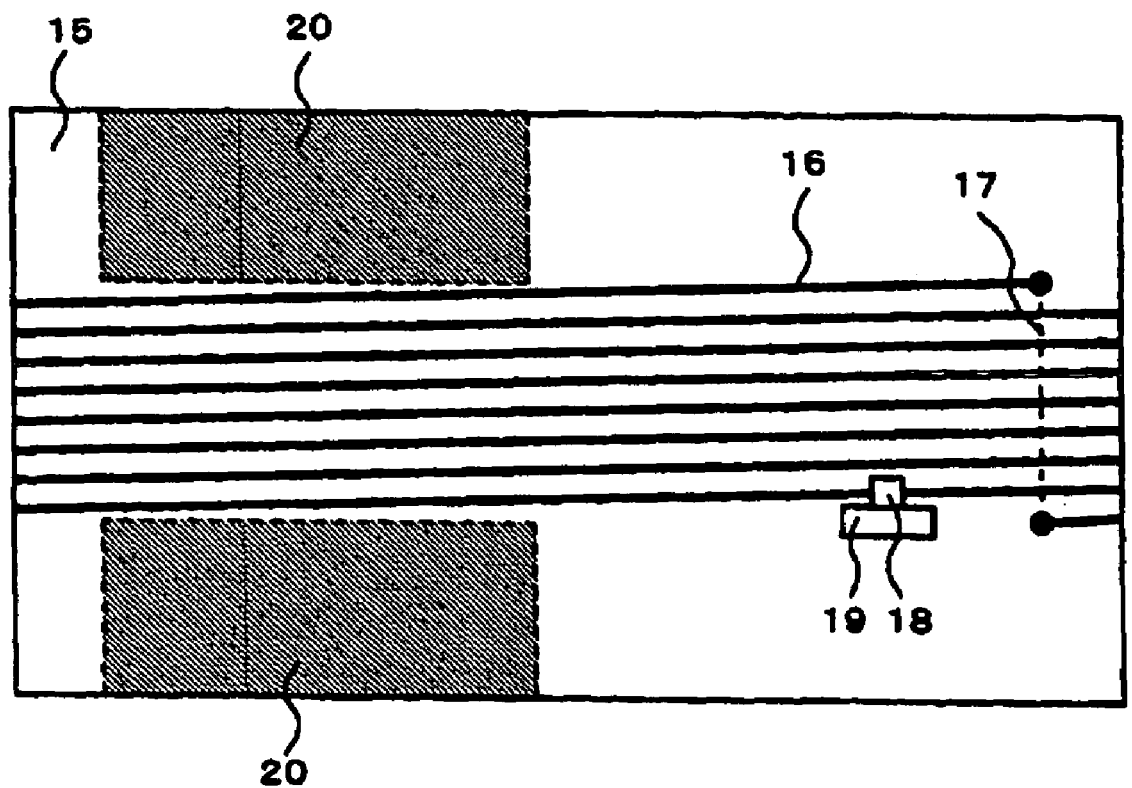
FIG. 15 shows the plane-shaped FPC before being wound around the magnetic core according to the second modification of the second embodiment.

In the second embodiment, the pattern shape of the shield conductor pattern 20 of the FPC 15 is capable of being modified in various ways, not limited to the above-mentioned case, and has various modifications as shown in FIGS. 13 to 15. The example as shown in FIGS. 9 to 12 shows the structure where the shield conductor pattern 20 is disposed in the lower area of the magnetic core 14 when the FPC 15 is wound around the magnetic core 14. The first modification is provided with a structure such that the shield conductor pattern 20 is disposed in both the upper area and lower area of the magnetic core 14.

The structure of the shield conductor pattern 20 in the first modification will be described below with reference to FIGS. 13 and 14. As shown in FIG. 13, the first modification is characterized in that the area of the shield conductor pattern 20 is increased which is formed on the other side of the FPC 15. In other words, the shield conductor pattern 20 is formed only in the left area in the case of FIG. 11, while being formed in the entire area including the left area and right area in the case of FIG. 13.

Then, as shown in FIG. 14, when the FPC 15 with the shield conductor pattern 20 in FIG. 13 formed thereon is wound around the magnetic core 14, the shield conductor pattern 20 is disposed in both the upper area and lower area of the magnetic core 14. At this point, the linear conductor pattern 16 formed on one side of the FPC 15 is surrounded by the shield conductor pattern 20.

Thus, in the first modification, the shield conductor pattern 20 is disposed above and under the magnetic core 14, and when the metal article approaches in the either direction, upper side or lower side of the RFID tag 1, the positional relationship is obtained such that the shield conductor pattern 20 exists between the coil-shaped antenna and the metal article. In other words, according to the first modification, even when the metal article approaches in the direction for attaching the RFID tag 1 or in the opposite direction, the advantage is produced of reducing effects on frequency characteristics of the coil-shaped antenna. In addition, as a result of the fact that the area of the shield conductor pattern 20 is increased and that the capacitive coupling with the coil-shaped antenna is increased, the resonance frequency of the RFID tag 1 is decreased, and therefore, design conditions need to be determined in consideration of such decrease.

A structure of the shield conductor pattern 20 in the second modification will be described below with reference to FIG. 15. As shown in FIG. 15, in the second modification, the shield conductor pattern 20 formed on the other side of the FPC 15 has a distribution different from that in FIG. 11. In other words, with respect to the shield conductor pattern 20 as shown in FIG. 15, the shield conductor pattern 20 is not formed in an area opposed to the linear conductor patterns 16, while being formed in a peripheral area that is not opposed to the linear conductor patterns 16.

Since the shield conductor pattern 20 is distributed as described above, in the second modification, when the FPC 15 is wound around the magnetic core 14, such a positional relationship is obtained that the metal article placed under the RFID tag 1 is opposed to the coil-shaped antenna, and the shield conductor pattern 20 is disposed on the side portion. Meanwhile, the linear conductor patterns 16 and the shield conductor pattern 20 are not directly opposed to each other, and therefore, the capacitive coupling therebetween is decreased. Accordingly, effects of an approaching external metal article on frequency characteristics of the coil-shaped antenna are slightly larger than in the example as described above, but are reduced to some extent, and such an advantage is obtained that it becomes hard for the resonance frequency of the RFID tag 1 to decrease.

The manufacturing process of the RFID tag 1 in the second embodiment is basically similar to that in the first embodiment. In the second embodiment, it is necessary to correspond to the structure as shown in FIGS. 9 and 10 the method of forming conductor patterns on the FPC 15 and the method of winding the FPC 15 around the magnetic core 14. In other respects including the rough adjustment by removing the linear conductor pattern 16 and adjustment of the capacitance of the capacitor 19, the same methods as in the first embodiment are applicable.

The invention claimed is:

1. An RFID tag which is provided with a coil-shaped antenna such that a conductor is placed on a periphery of a magnetic core, said RFID tag comprising:
    a magnetic core;
    an FPC (flexible printed circuit wound on the periphery of said magnetic core;
    two or more linear conductor patterns formed in parallel with one another on said FPC;
    an IC that is connected to said linear conductor patterns and disposed on said FPC;
    a crossover pattern that electrically connects one end and other end of outermost linear conductor patterns among said linear conductor patterns formed in parallel with one another;
    wherein said two or more linear conductor patterns, adjacent linear conductor patterns in a joint portion in said wound FPC are electrically connected in respective start edges and end edges.

2. An RFID tag which is provided with a magnetic core including at least one magnetic material, a coil-shaped antenna such that a conductor is placed in a helical form on a periphery of said magnetic core, an IC,
    wherein said coil-shaped antenna is obtained by winding an FPC around said magnetic core in which on one side of said FPC are formed two or more linear conductor patterns in parallel with one another, electrically connecting adjacent linear conductor patterns, thereby forming a helical current path on the periphery of said magnetic core, and connecting one end and other end of said current path.

3. An RFID tag according to claim 2, wherein a crossover pattern that electrically connects the one end and the other end of said current path is formed on other side of said FPC different from a side on which said linear conductor patterns are formed.

4. An RFID tag according to any of claims 1–3, wherein said linear conductor patterns and said IC are formed on an inner side of said FPC wound around said magnetic core.

5. An RFID tag according to claim 4, wherein said magnetic core is provided with a concave portion to store said IC.

6. An RFID tag according to claim 1, further comprising a capacitive load which is formed on said FPC and connected to said IC.

7. An RFID tag according to claim 6, wherein said capacitive load has a comb-shaped conductor pattern formed on one side of said FPC and a conductor pattern provided in a position opposed to said comb-shaped conductor pattern on other side of said FPC.

8. An RFID tag according to any of claims 1–3, wherein said two or more linear conductor patterns are formed on an inner side of said FPC wound around said magnetic core, while a shield conductor pattern that is not electrically connected to said coil-shaped antenna is formed on an outer side of said FPC wound around said magnetic core.

9. An RFID tag according to claim 8, wherein said shield conductor pattern is disposed at least on a side opposed to an object to which the RFID tag is attached of said FPC wound around said magnetic core.

10. An RFID tag according to claim 8, wherein said FPC is bonded in a vicinity of a corner of said magnetic core.

11. An RFID tag according to claim 8, wherein all of said shield conductor pattern formed on the outer side of said FPC wound around said magnetic core are disposed in an area that is not opposed to said linear conductor patterns.

12. A manufacturing method of an RFID tag, the method comprising the steps of:
    forming two or more linear conductor patterns and a crossover pattern on an FPC;
    placing an IC on said FPC;
    winding said FPC around a magnetic core;
    electrically connecting respective start edges and end edges of said linear conductor patterns adjacent to one another.

13. A manufacturing method of an RFID tag according to claim 12, further comprising a step of forming a capacitive load on said FPC.

14. A manufacturing method of an RFID tag according to claim 13, wherein said capacitive load has a comb-shaped conductor pattern formed on one side of said FPC and a conductor pattern provided in a position opposed to said comb-shaped conductor pattern on the other side of said FPC.

15. A manufacturing method of an RFID tag according to claim 13, further comprising a step of measuring a resonance frequency of a coil after forming the coil due to said FPC, and adjusting an electrostatic capacitance of said capacitive load according to a drift from the desired resonance frequency.

16. A manufacturing method of an RFID tag according to claim 15, wherein said step of adjusting the electrostatic capacitance is performed by removing at least a part of said comb-shaped conductor pattern formed on one side of said FPC or said conductor pattern provided in a position opposed to said comb-shaped conductor pattern on the other side of said FPC.

17. A manufacturing method of an RFID tag, the method comprising the steps of:
- forming two or more linear conductor patterns on one side of an FPC;
- winding said FPC around a magnetic core;
- electrically connecting said linear patterns adjacently positioned to form a helical current path on a periphery of said magnetic core;
- connecting one end and other end of said helical current path.

18. A manufacturing method of an RFID tag, the method comprising the steps of:
- forming two or more linear conductor patterns on one side of an FPC;
- forming a crossover pattern that electrically connects one end and other end of a helical current path on other side different from a side on which said linear conductor patterns are formed;
- winding said FPC around a magnetic core;
- electrically connecting said linear patterns adjacently positioned to form the helical current path on a periphery of said magnetic core;
- electrically connecting one end and other end of said helical current path.

19. A manufacturing method of an RFID tag according to any of claims 12–18, wherein said linear conductor patterns have dummy connecting portions where adjacent linear conductor patterns are connected at the start edges or end edges and form a meander-shaped current path, and further comprising the steps of:
- performing an operation check before the step of connecting;
- removing said dummy connecting portions before or after said step of connecting.

20. A manufacturing method of an RFID tag according to any of claim 12–18, wherein said two or more linear conductor patterns are formed on one side of said FPC, a shield conductor pattern is formed on other side of said FPC, and in said step of winding said FPC around said magnetic core, a side of said FPC on which said linear conductor patterns are formed is an inner side when said FPC is wound around said magnetic core, while other side of said FPC on which said shield conductor pattern is formed is an outer side when said FPC is wound around said magnetic core.

21. A manufacturing method of an RFID tag according to claim 20, wherein said shield conductor pattern is formed on a part of the side on which said shield conductor pattern is formed, and in said step of winding said FPC around said magnetic core, said FPC is wound so that said shield conductor pattern is disposed at least in an area opposed to an object to which the RFID tag is attached.

22. A manufacturing method of an RFID tag according to claim 18, wherein in said step of forming said helical current path, said wound FPC is bonded, thereby connecting adjacent linear conductor patterns and forming said helical current path.

23. A manufacturing method of an RFID tag according to claim 22, wherein a joint portion where said wound FPC bonded is disposed in the vicinity of a corner of said magnetic core.

* * * * *